(12) United States Patent
Seki et al.

(10) Patent No.: US 8,173,543 B2
(45) Date of Patent: May 8, 2012

(54) METHOD OF FORMING HOLE IN SEMICONDUCTOR DEVICE USING MASK

(75) Inventors: Katsuyuki Seki, Gunma (JP); Akira Suzuki, Gunma (JP); Koujiro Kameyama, Gunma (JP); Takahiro Oikawa, Gunma (JP)

(73) Assignees: SANYO Semiconductor Co., Ltd., Gunma (JP); SANYO Semiconductor Manufacturing Co., Ltd., Ojiya-shi (JP); Semiconductor Components Industries, LLC, Phoenix, AZ (US)

( * ) Notice: Subject to any disclaimer, the term of this patent is extended or adjusted under 35 U.S.C. 154(b) by 757 days.

(21) Appl. No.: 11/878,796

(22) Filed: Jul. 26, 2007

(65) Prior Publication Data

US 2008/0023846 A1    Jan. 31, 2008

(30) Foreign Application Priority Data

Jul. 27, 2006    (JP) ................. 2006-204353

(51) Int. Cl.
*H01L 21/44*    (2006.01)
*H01L 21/311*    (2006.01)

(52) U.S. Cl. ............ 438/667; 438/672; 438/700

(58) Field of Classification Search .......... 438/666–668, 438/672, 675, 700, 701, 713; 257/E21.214, 257/E21.218, E21.249, E21.256, E21.597, 257/E23.01

See application file for complete search history.

(56) References Cited

U.S. PATENT DOCUMENTS

| | | | |
|---|---|---|---|
| 4,689,112 A | 8/1987 | Bersin | |
| 4,729,815 A | 3/1988 | Leung | |
| 6,037,266 A | 3/2000 | Tao et al. | |
| 6,194,323 B1 | 2/2001 | Downey et al. | |
| 6,821,901 B2 * | 11/2004 | Song et al. | ......... 438/700 |
| 6,831,018 B2 | 12/2004 | Kanegae | |

(Continued)

FOREIGN PATENT DOCUMENTS

CN    1647257    7/2005

(Continued)

OTHER PUBLICATIONS

Partial European Search Report mailed Mar. 14, 2008, directed to counterpart EP 07014822.6; 7 pages.
European Search Report, dated Jun. 23, 2008, directed to counterpart European Patent Application No. 07014822.6. 11 pages.

*Primary Examiner* — Hung Vu
(74) *Attorney, Agent, or Firm* — Morrison & Foerster LLP

(57) ABSTRACT

The invention provides a method of manufacturing a semiconductor device which achieves high reliability and high yield as well as high production efficiency. Back surface grinding (back grinding) is performed to a semiconductor substrate to thin the semiconductor substrate. A damaged layer formed by the back surface grinding is not removed at this time, and a photoresist layer is selectively formed on the back surface of the semiconductor substrate. The semiconductor substrate is then etched using the photoresist layer as a mask to form a via hole. The photoresist layer is then removed with the semiconductor substrate still placed in an etcher used in the etching process subsequently after the formation of the via hole. In this manner, the etching process and the next ashing process are performed sequentially in one apparatus. Then a process of removing the damaged layer on the back surface of the semiconductor substrate and a process of smoothing the sidewall of the via hole are simultaneously performed subsequently after the ashing process in the same apparatus.

6 Claims, 8 Drawing Sheets

U.S. PATENT DOCUMENTS

| | | |
|---|---|---|
| 7,169,440 B2 | 1/2007 | Balasubramaniam et al. |
| 7,220,678 B2 | 5/2007 | Nozawa et al. |
| 7,314,792 B2 * | 1/2008 | Kim et al. .................... 438/225 |
| 2001/0028105 A1 | 10/2001 | Hashimoto et al. |
| 2004/0203238 A1 | 10/2004 | Moll et al. |
| 2005/0112884 A1 | 5/2005 | Gormley |
| 2005/0130436 A1 | 6/2005 | Nozawa et al. |
| 2005/0196957 A1* | 9/2005 | Kameyama et al. .......... 438/637 |
| 2005/0263869 A1 | 12/2005 | Tanaka et al. |
| 2005/0269704 A1* | 12/2005 | Kameyama et al. .......... 257/751 |
| 2006/0033168 A1 | 2/2006 | Umemoto et al. |
| 2006/0105275 A1 | 5/2006 | Maloney et al. |
| 2006/0108691 A1* | 5/2006 | Kameyama et al. .......... 257/758 |
| 2006/0246730 A1* | 11/2006 | Kim et al. .................... 438/700 |
| 2007/0281474 A1 | 12/2007 | Suzuki et al. |

FOREIGN PATENT DOCUMENTS

| | | |
|---|---|---|
| CN | 101075554 | 11/2007 |
| EP | 1 471 571 | 10/2004 |
| EP | 1 564 807 A2 | 8/2005 |
| JP | 2003-59911 | 2/2003 |
| JP | 2004-296474 | 10/2004 |
| JP | 2005-19522 | 1/2005 |
| JP | 2005-277173 | 10/2005 |
| JP | 2006-012889 | 1/2006 |
| JP | 2006-12889 | 1/2006 |
| JP | 2006-41018 | 2/2006 |
| KR | 2000-009481 | 2/2000 |
| WO | WO-01/01468 A1 | 1/2001 |

* cited by examiner

METHOD OF FORMING HOLE IN SEMICONDUCTOR DEVICE USING MASK

CROSS-REFERENCE OF THE INVENTION

This invention claims priority from Japanese Patent Application No. 2006-204353, the content of which is incorporated herein by reference in its entirety.

BACKGROUND OF THE INVENTION

1. Field of the Invention

The invention relates to a method of manufacturing a semiconductor device, particularly an etching process and a process of removing a mask layer used in the etching process.

2. Description of the Related Art

A conventional method of manufacturing a semiconductor device includes an etching process for shaping a foundation insulation film, a metal layer, a semiconductor substrate and the like into a predetermined pattern using a photoresist layer as a mask and an ashing process for removing the photoresist layer used in the etching process.

A description will be given on an example of the conventional method of manufacturing the semiconductor device. As shown in FIG. 13A, back grinding is performed to the back surface of a semiconductor substrate 100 using a grinder to form a semiconductor substrate 100 having a predetermined thickness (100 to 150 µm, for example).

As shown in FIG. 13B, the back surface of the semiconductor substrate 100 is then etched with a predetermined etcher (a wet etcher or a dry etcher) to remove a mechanically damaged layer (about 30 µm) such as a rough portion of the back surface which is caused by the back grinding. Therefore, the back surface of the semiconductor substrate 100 is smoothed.

As shown in FIG. 13C, a photoresist layer 101 is then selectively formed on the back surface of the semiconductor substrate 100 by a photolithography. The semiconductor substrate 100 is dry-etched using the photoresist layer 101 as a mask. This etching process is performed in a vacuum chamber 111 of a dry etcher 110 as shown in FIG. 14A.

In FIG. 14A, the semiconductor substrate 100 is mechanically fixed to a stage 113 with a support member 112. FIG. 14B is a top plan view of the stage 113. The support member 112 is located on the edge of the semiconductor substrate 100, covering several millimeters. A portion covered by the support member 112 is not properly subjected to the etching, and thus removed finally as a non-product portion. An RF power supply 114 is connected with the stage 113. The RF power supply 114 is a high frequency power supply supplying power for generating plasma in the vacuum chamber 111.

An opening 102 is formed in the semiconductor substrate 100 by the etching using the photoresist layer 101 as a mask as shown in FIG. 13D. The opening 102 may be formed by a so-called Bosch process. The Bosch process is used to produce a deep vertical trench in the semiconductor substrate and consists of two periodically alternating processes, which are a plasma etching process in which a surface of the semiconductor substrate is plasma etched isotropically using a $SF_6$ gas and a plasma deposition process in which carbon polymers are deposited as a protection film using a $C_4F_8$ gas on a sidewall of the trench formed by the plasma etching process.

The semiconductor substrate 100 is then taken from the vacuum chamber 111, and transferred into a chamber of an asher (a plasma asher, for example) (not shown). This asher is also basically provided with a vacuum chamber, a stage, a support member, an RF power supply and the like, similar to the dry etcher 100 described above. The photoresist layer 101 is then removed by a plasma ashing using, for example, oxygen plasma. A portion covered by the support member is not subjected to plasma and the ashing is not properly performed thereto, so that the ashing is performed again after the support member is shifted.

When the sidewall of the opening 102 is not formed smooth by the overhang phenomenon, the Bosch process or the like, the semiconductor substrate 100 is transferred from the asher to the etcher again and the sidewall of the opening 102 is etched for smoothing. This is necessary because that a homogeneous film deposition in the opening 102 is not achievable in the next step unless the sidewall is smooth. It is known that when the Bosch process is used for forming the opening 102 a rough wavy surface (scallops 103) is formed on the sidewall of the via hole 102 as shown in FIG. 13D. Therefore, it is necessary to perform the smoothing process particularly when the Bosch process is used.

The sidewall of the opening 102 is smoothed by the smoothing process as shown in FIG. 13E, and thereafter a homogeneous deposition is achieved in the opening 102.

In this manner, the etching process and the ashing process in the conventional method of manufacturing the semiconductor device are performed using the different dedicated apparatuses, respectively.

The relevant technique to this is described in the Japanese Patent Application Publication No. 2006-12889, for example.

As described above, the etching process and the ashing process are conventionally performed in the different dedicated apparatuses, respectively. Therefore, when the ashing process is to be performed after the etching process or the etching process is to be performed after the ashing process, it is necessary to transfer the semiconductor substrate 100 each time, thereby largely reducing production efficiency. Furthermore, a mechanical defect may occur in the semiconductor substrate 100 during the transfer.

Furthermore, since removing and setting works of the support member 112 are needed when the semiconductor substrate 100 is transferred between the etcher and the asher, it is difficult to locate the support member 112 in the exactly same position again. As described above, the portion covered by the support member 112 is not properly etched, and thus is not generally used as a product die. Therefore, when the support member is used for fixing the semiconductor substrate to the stage, the position of the support member is slightly shifted each time when the etching process and the ashing process are repeated, thereby degrading the reliability and the yield of the end product.

The invention is directed to a semiconductor device and a method of manufacturing the semiconductor device which achieve high reliability and high yield as well as increased production efficiency.

SUMMARY OF THE INVENTION

This invention is directed to solve the problems addressed above and has following features. The invention provides a method of manufacturing a semiconductor device, including: forming a mask layer selectively on a front surface of a semiconductor substrate; forming an opening in the semiconductor substrate by dry-etching the semiconductor substrate using the mask layer as a mask with an etcher; and removing the mask layer with the etcher with the semiconductor substrate still placed in the etcher.

The method of the invention further includes grinding one surface of the semiconductor substrate to thin the semiconductor substrate before the forming of the mask layer and smoothing one surface of the semiconductor substrate, wherein the removing of the mask layer and the smoothing of one surface of the semiconductor substrate are sequentially performed with the semiconductor substrate placed in the etcher.

The method of the invention further includes smoothing a sidewall of the opening, wherein the removing of the mask layer and the smoothing of the sidewall of the opening are sequentially performed with the semiconductor substrate placed in the etcher.

The invention also provides a semiconductor device including: a semiconductor substrate having a via hole penetrating the semiconductor substrate from a back surface to a front surface thereof; a pad electrode formed on the front surface of the semiconductor substrate, covering the via hole; and a through-hole electrode formed in the via hole and electrically connected with the pad electrode, wherein the via hole is tapered down of which a sidewall on a back surface side of the semiconductor substrate is curved and a diameter reduces from the back surface side to a front surface side of the semiconductor substrate, and is etched for smoothing the sidewall.

DETAILED DESCRIPTION OF THE INVENTION

Figure 1:
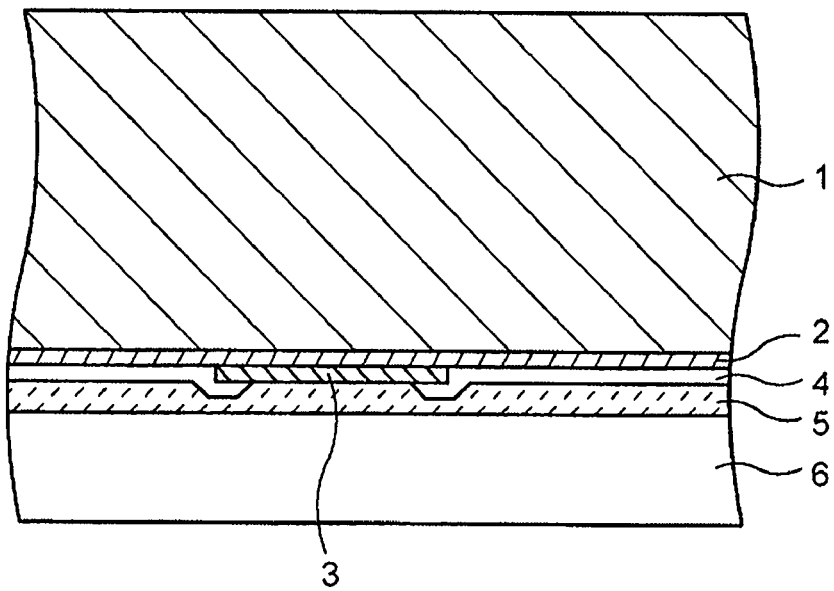
FIGS. 1 and 2 are cross-sectional views showing a semiconductor device and a method of manufacturing the semiconductor device of an embodiment of the invention.

An embodiment of this invention will be explained hereinafter, referring to the drawings. FIGS. 1 through 10 are cross-sectional views showing a manufacturing method of a semiconductor device according to one embodiment of this invention. Although the manufacturing process is applied to a wafer in which a plurality of the semiconductor devices is arrayed in a matrix bordered with predetermined dicing lines, only one of the semiconductor devices is described hereafter for the simplicity of explanation.

First, as shown in FIG. 1, there is provided a semiconductor substrate 1, in a front surface of which an electronic device (a CCD, a light-receiving device such as a CCD and an infrared sensor, a light-emitting device or other semiconductor device, for example) is formed. The semiconductor substrate 1 is 8 inches (200 mm) in diameter and 300-700 μm in thickness, for example. A first insulation film 2 (a silicon oxide film or a BPSG (Boro-Phospho Silicate Glass) film formed by thermal oxidation or CVD, for example) of a thickness of 2 μm, for example, is formed on the front surface of the semiconductor substrate 1.

A metal layer such as aluminum (Al), aluminum alloy, copper (Cu) or the like is formed by sputtering, plating or other film forming method. After that, patterning is performed by etching the metal layer using a photoresist layer (not shown) as a mask. With this, a pad electrode 3 of a thickness of 1 μm, for example, is formed on the first insulation film 2. The pad electrode 3 is electrically connected with the electronic device and its peripheral element on the semiconductor substrate 1 through a wiring (not shown).

Next, a passivation film 4 (a silicon nitride film, for example) that covers a portion of the pad electrode 3 on the front surface of the semiconductor substrate 1 is formed by CVD, for example. Next, a supporter 6 is bonded to the front surface of the semiconductor substrate 1 including the pad electrode 3 through an adhesive layer 5 made of an epoxy resin, resist, acryl or the like. The supporter 6 may be a film-shaped protection tape, may be a rigid substrate made of a glass, quartz, ceramics, plastics, a metal or the like, or may be made of a resin. It is preferable that the supporter 6 is a rigid substrate in order to firmly support the semiconductor substrate 1 of reducing thickness and to accommodate hands-free automatic transfer. The supporter 6 serves to support the semiconductor substrate 1 as well as protecting a surface of the device.

Figure 2:
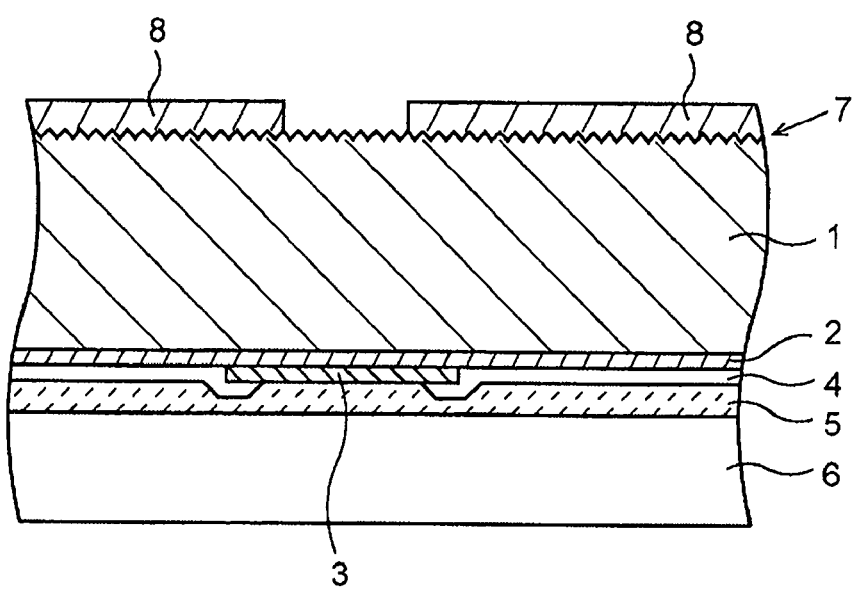

Next, back grinding by a back surface grinder is applied to a back surface of the semiconductor substrate 1 to reduce the thickness of the semiconductor substrate 1 down to a predetermined thickness (about 100-150 μm, for example). This back grinding does not provide the semiconductor substrate 1 with a perfectly smooth back surface and causes a mechanically damaged rough layer 7. It is noted that the damaged layer 7 shown in FIG. 2 is largely exaggerated. The grinding process may be performed by an etching or a combination of use of a grinder and an etching. This process is not necessarily performed when the thinning of the semiconductor substrate 1 is not necessary.

Next, as shown in FIG. 2, a photoresist layer 8 is selectively formed on the back surface of the semiconductor substrate 1 by a photolithography. The photoresist layer 8 has an opening on the back surface of the semiconductor substrate 1 at a location corresponding to the pad electrode 3. Although the photoresist layer is used as a mask layer in this embodiment, an insulation film such as a silicon oxide film or a silicon nitride film may be used as a mask layer. Although the damaged layer 7 is removed after the back grinding in the conventional method, the damaged layer 7 is removed at the same time as when a sidewall of a via hole is smoothed subsequently after an ashing process that will be described below in this embodiment. Therefore, compared with the conventional method, the number of times to transfer the semiconductor substrate 1 is reduced and thus production efficiency is enhanced. There is also an advantage in the rough surface of the damaged layer 7 that the adhesion of the photoresist layer 8 to the semiconductor substrate 1 is enhanced.

Figure 3:
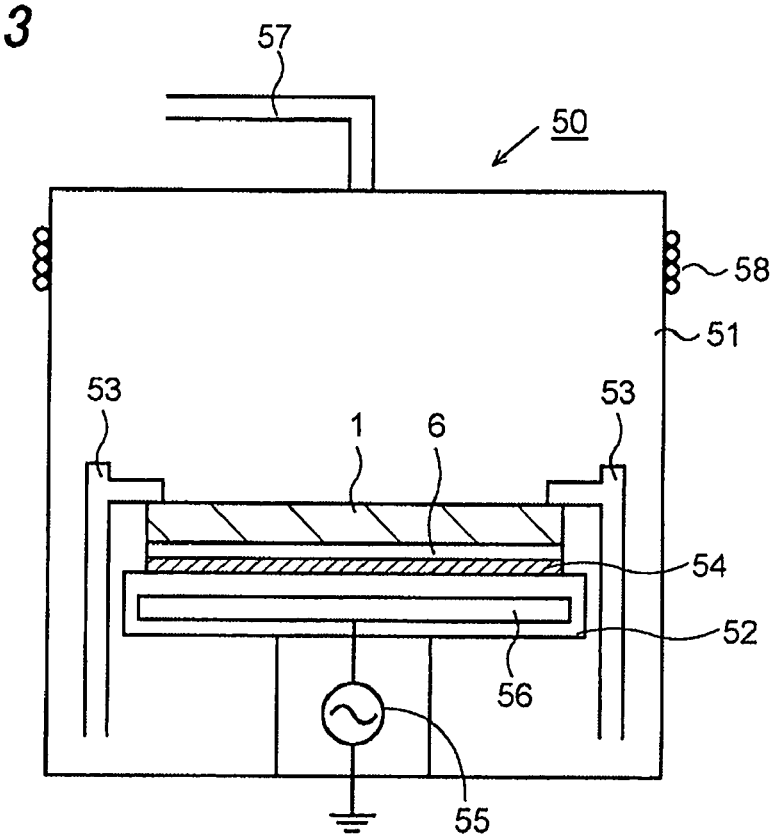
FIG. 3 is a cross-sectional view showing an etcher used in the method of manufacturing the semiconductor device of the embodiment of invention.

Next, a predetermined region in the semiconductor substrate 1 is etched by the Bosch process using the photoresist layer 8 as a mask. In detail, as shown in FIG. 3, the semiconductor substrate 1 is placed on a stage 52 set in a vacuum chamber 51 of an etcher 50, and mechanically fixed with a support member 53. The support member 53 is located on the edge of the semiconductor substrate 1, covering several millimeters.

Although the electrostatic suction method that is generally known may be also used for fixing the semiconductor substrate 1 to the stage 52, enough suction is not obtained when the supporter 6 is insulative such as a glass. Therefore, the semiconductor substrate 1 is mechanically fixed with the support member 53 in this embodiment. However, it is possible to use the electrostatic suction method for fixing the semiconductor substrate to the stage without using the support member 53 as long as the enough electrostatic suction is obtained and leakage of a helium layer 54 does not occur. When the electrostatic suction method is usable, compared with the case using the support member 53, the method has an advantage that the etching process, the ashing process or the like are performed to the edge of the substrate without a gap and the mechanical damage of the substrate is reduced, thereby enhancing the yield. It is noted that the electrostatic suction method is a method of attaching a semiconductor substrate to a stage provided with a dielectric layer by suction with force generated between the stage and the semiconductor substrate by applying a voltage therebetween.

A helium (He) gas is then supplied from the stage 52 side through piping (not shown) to form the helium layer 54 between the supporter 6 and the stage 52. This helium layer 54 is a layer for cooling the substrate. The temperature of the stage 52 is reflected on the semiconductor substrate 1 side through the helium layer 54 to make the in-plane temperature homogeneous and thus achieve homogeneous accuracy in etching the whole surface of the semiconductor substrate 1.

The support member 53 also serves to prevent the helium layer 54 leaking from the stage surface to the outside in excess by pressure from above as well as to fix the semiconductor substrate 1. An alternating voltage is supplied to a lower electrode 56 by an RF power supply 55. The vacuum chamber 51 is provided with piping 57 for leading a gas as an etching gas or an ashing gas, an exhaust pipe (not shown) for the gas, a vacuum pump (not shown) or the like. An ICP coil 58 is also provided for supplying power to a plasma source.

An ICP (Inductively Coupled Plasma) type etcher is used as the etcher 50, for example. The ICP type etcher is an apparatus for etching an object with dense plasma generated from a supplied reaction gas in a vacuum chamber by an inductive coupling discharge method in which a high frequency is supplied to an ICP coil.

The etching is then performed using the etcher 50 by alternating a plasma etching process at a pressure of 10-50 mTorr, a $SF_6$ gas flow rate of 300-400 scc/min, an $O_2$ gas flow rate of 30-40 scc/min, an ICP power of 1500-2000 W, and 20-30 W at a lower electrode for 10 seconds and a plasma deposition process at a pressure of 20-30 mTorr, a $C_4F_8$ gas flow rate of 150-200 scc/min and an ICP power of 1200-1700 W for 5 seconds.

Figure 4:
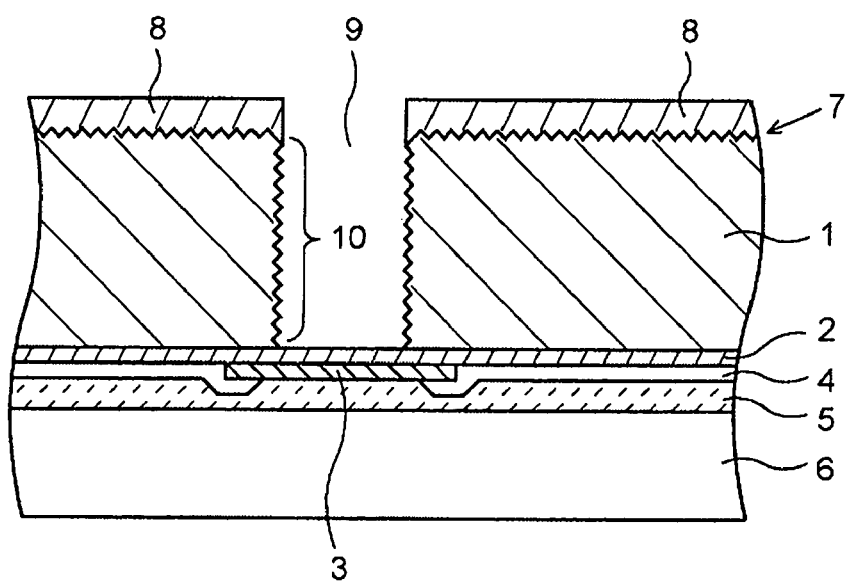
FIGS. 4 to 12 are cross-sectional views showing the semiconductor device and the method of manufacturing the semiconductor device of the embodiment of the invention.

While a via hole (opening) 9 penetrating through a thickness of the semiconductor substrate 1 is formed by the Bosch process, a surface of a sidewall of the via hole 9 is shaped into scallops 10, as shown in FIG. 4. A diameter of the via hole 9 is about 30-50 µm, for example, a depth thereof is about 100-150 µm, for example, and a step height of the scallops 10 is about 6000 Å, for example. The step height of the scallops 10 becomes larger as an amount of side etching in a lateral direction by the $SF_6$ gas increases.

The closer to a bottom of the via hole 9 (lower side in FIG. 4) a location is, the lower an etch rate of the plasma etch at the location is. Therefore, the step height of the scallops 10 is smaller and closer to flat at a location closer to the bottom of the via hole 9 than that at a location in upper side of the via hole 9 (upper side in FIG. 4). The via hole 9 is shown to have a straight shape in FIG. 4. However, the actual via hole 9 formed by the Bosch process tends to be tapered down, that is, a diameter of the opening reduces as the depth of the via hole 9 becomes greater.

The via hole 9 may be formed by an etching without using the Bosch process, alternatively. Although not shown, the via hole 9 does not necessarily penetrate through the substrate 1 and its bottom may be located in the middle of the semiconductor substrate 1.

Figure 5A:
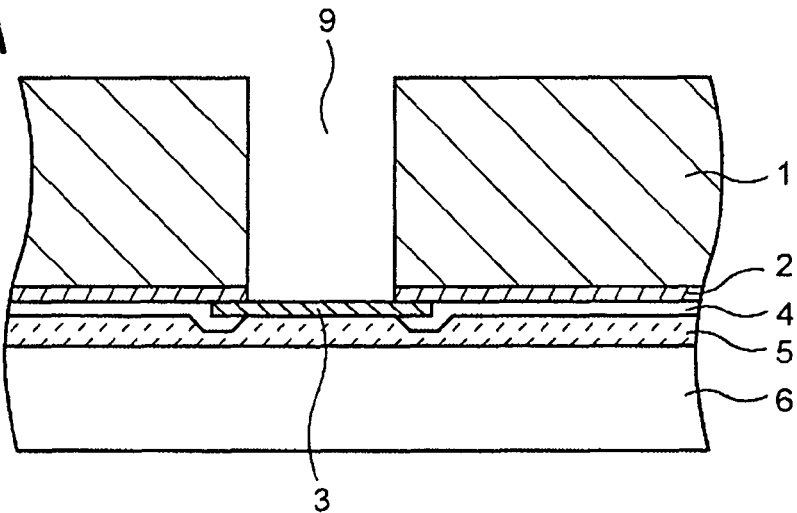
Figure 5B:
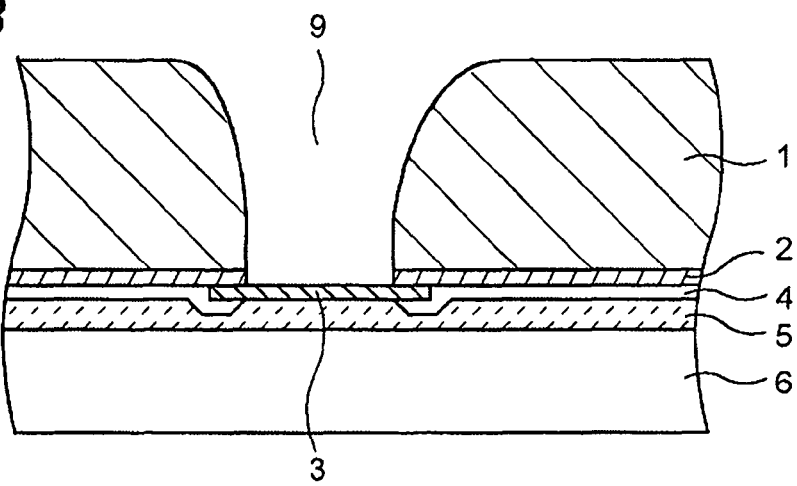
Figure 6:
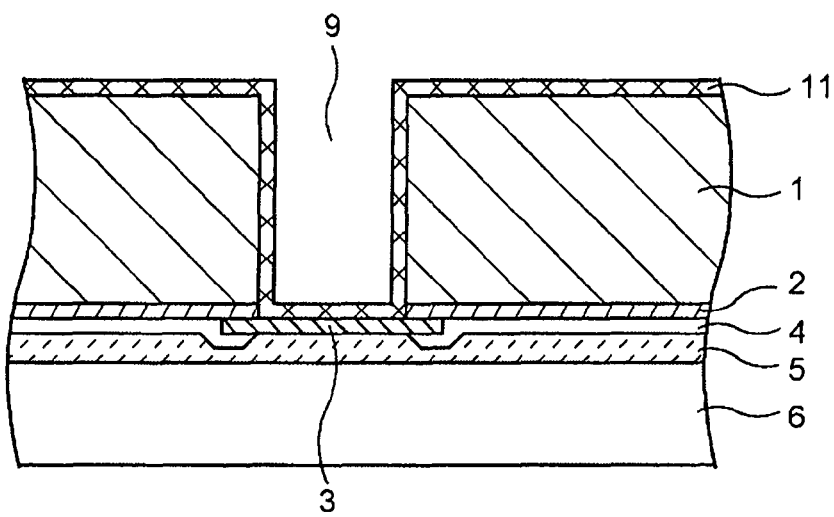

Next, in the etcher 50 which is used in the etching for forming the via hole 9 described above, the gas type in the vacuum chamber 51 is changed to an ashing gas, the condition of pressure, power of the etcher or the like is also changed, and the photoresist layer 8 is plasma removed (ashing) as shown in FIG. 5A or FIG. 5B. That is, this ashing process is performed subsequently after the etching process described above, with the semiconductor substrate 1 still placed in the vacuum chamber 51. The ashing process is performed at pressure of 10-50 mTorr, an $O_2$ gas flow rate of 150-200 scc/min, ICP power of 2000-3000 W, and 30-80 W at a lower electrode, for example. When an insulation film such as a silicon oxide film or a silicon nitride film is used as a mask layer instead of the photoresist layer 8, the condition of pressure, a gas or the like in the etcher is optimized for removing the insulation film and the mask layer is removed.

Next, the gas type in the vacuum chamber 51 is changed from the ashing gas to the etching gas, and the condition of pressure, power of the etcher or the like is also changed accordingly. The smoothing of the back surface of the semiconductor substrate 1 (the removing of the damaged layer 7) and the smoothing of the sidewall of the via hole 9 (the removing of the scallops 10) are then simultaneously performed by a dry-etching method.

The via hole 9 after the dry-etching may form a straight shape as shown in FIG. 5A or may be tapered down where the upper portion (the back surface side of the semiconductor substrate 1) is gently curved by changing the dry-etching condition as shown in FIG. 5B. There is an advantage in the via hole 9 tapered down that a more homogeneous film is deposited in the via hole 9, compared with the via hole 9 forming the straight shape.

In this manner, the smoothing of the back surface of the semiconductor substrate 1 and the smoothing of the sidewall of the via hole 9 are simultaneously performed subsequently after the formation of the via hole 9 and the removing of the photoresist layer 8, with the semiconductor substrate 1 still placed in the vacuum chamber 51 of the etcher 50. The removing of the damaged layer 7 and the smoothing of the sidewall of the via hole 9 are performed at pressure of 20-80 mTorr, a $SF_6$ gas flow rate of 500-600 scc/min, a $O_2$ gas flow rate of 0-60 scc/min, ICP power of 1500-2500 W, and 50-100 W at a lower electrode, for example. A low pressure, high power and $CF_4$ gas rich condition is preferable for enhancing the removing effect of the scallops 10, that is, for smoothing the sidewall of the via hole 9.

Then a wet treatment is performed according to needs to remove the photoresist layer 8 completely. This is necessary because the photoresist layer 8 that remains on the portion covered by the support member 53 may affect the next process.

Then the portion of the first insulation film 2 exposed in the via hole 9 is removed by etching to expose the pad electrode 3.

Next, a second insulation film 11 (a silicon oxide film or a silicon nitride film formed by CVD, for example) is formed over the entire back surface of the semiconductor substrate 1 including the sidewall of the via hole 9. The second insulation film 11 serves to isolate the semiconductor substrate 1 from conductive materials (a barrier layer 13, a seed layer 14, a through-hole electrode 15 and a wiring layer 16, that are to be described below).

Figure 7:
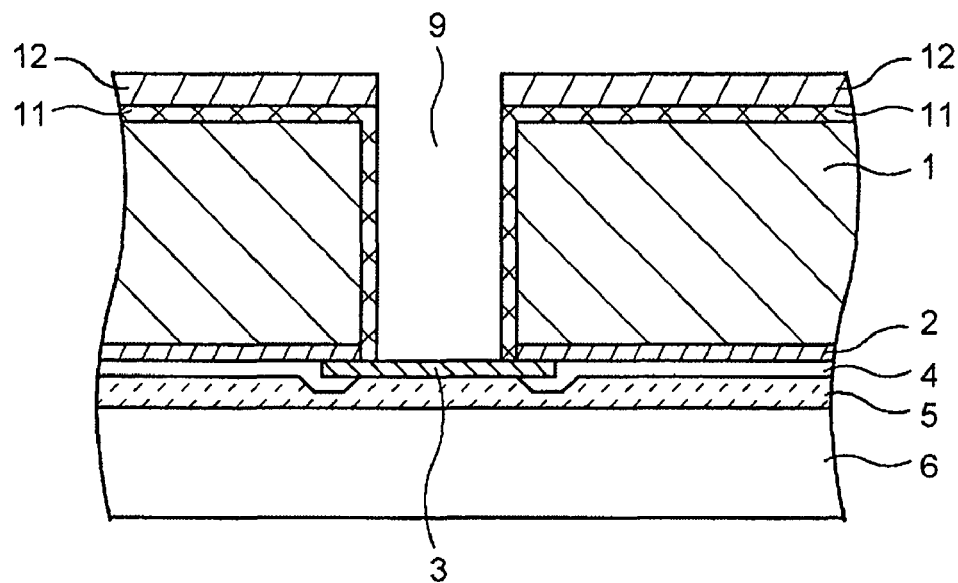

Next, a photoresist layer 12 is selectively formed on the back surface of the semiconductor substrate 1 and the second insulation film 11 in the bottom of the via hole 9 is removed by etching using the photoresist layer 12 as a mask, as shown in FIG. 7. A portion of the pad electrode 3 is exposed by the etching. Then the photoresist layer 12 is removed by an ashing process.

This process of etching the second insulation film 11 and the process of removing the photoresist layer 12 are also performed sequentially in the same etcher.

The etching may be performed without the mask (the photoresist layer 12) taking advantage of a varying thickness of the second insulation film 11, the thickness of which is greater on the back surface of the semiconductor substrate 1, reduces on the sidewall and further reduces toward the bottom of the via hole 9. The manufacturing process is optimized by not using the mask in the etching. Also, the first insulation film 2 and the second insulation film 11 may be removed in the same etching process.

Figure 8:
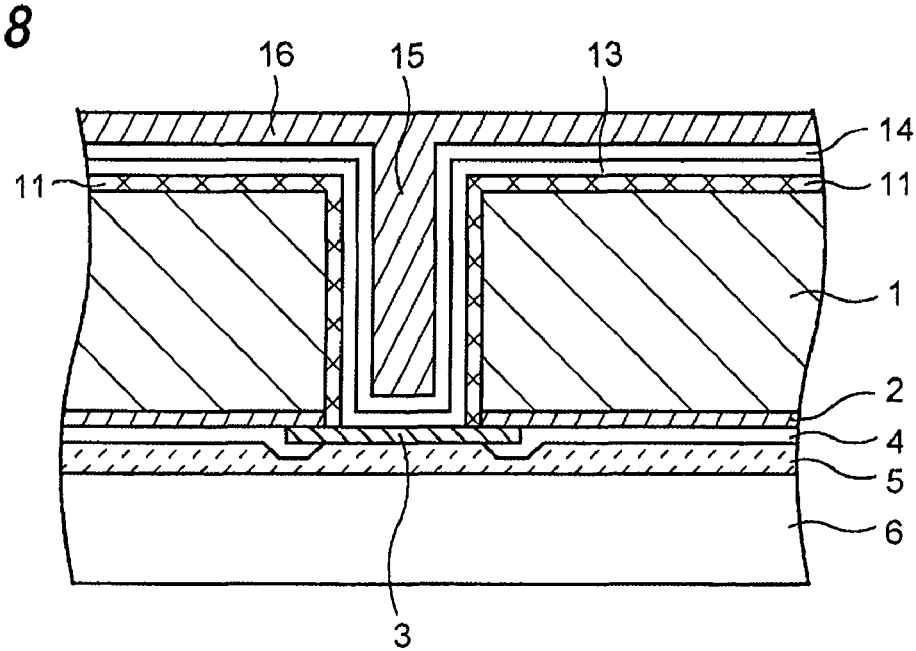

Next, the barrier layer 13 is formed on the sidewall of the via hole 9 and the back surface of the semiconductor substrate 1, as shown in FIG. 8. The barrier layer 13 is formed by sputtering, PVD (Physical Vapor Deposition), CVD or other film forming method. The barrier layer 13 is composed of a titanium (Ti) layer, a titanium nitride (TiN) layer, a tantalum (Ta) layer, a tantalum nitride (TaN) layer, a titanium tungsten (TiW) layer, a tungsten nitride (WN) layer, a zirconium nitride (ZrN) layer or the like.

The barrier layer 13 serves to prevent diffusion of metallic material composing the through-hole electrode 15 to be formed in the via hole 9, to prevent inter reaction between the metallic material and an conductor (the pad electrode 3 in this embodiment), and to improve adhesion of the through-hole electrode 15 to the semiconductor substrate 1, which will be described below. The barrier layer 13 is not limited to being formed of those specified materials as long as it serves as described above, and may be made of a single layer or stacked layers. The stacked layers are made of a combination of the materials mentioned above, such as the titanium layer/the titanium nitride layer, for example.

Next, the seed layer 14 is formed on the barrier layer 13, as shown in FIG. 8. The seed layer 14 is a conductive layer that serves as a foundation electrode to form the through-hole electrode 15 and the wiring layer 16 by plating as described below, and composed of a metal such as copper (Cu), ruthenium (Ru) or palladium (Pd). The seed layer 14 is formed by sputtering, PVD, CVD or other film forming method. A thickness of the seed layer 14 is about 50 nm, for example. Since the sidewall of the via hole 9 is smoothed, the coverage of the barrier layer 13 and the seed layer 14 is better than that in the conventional art.

Next, the through-hole electrode 15 made of copper and the wiring layer 16 continuously connected with it are formed on the seed layer 14 including the inside of the via hole 9 by electrolytic plating using the seed layer 14 as a plating electrode, as shown in FIG. 8. The through-hole electrode 15 is a conductive layer formed inside the via hole 12. The through-hole electrode 15 and the wiring layer 16 are electrically connected with the pad electrode 3 exposed in the bottom of the via hole 9 through the barrier layer 13 and the seed layer 14. Since the sidewall of the via hole 9 is smoothed, the through-hole electrode 15 and the wiring layer 16 are formed favorably.

Figure 11:
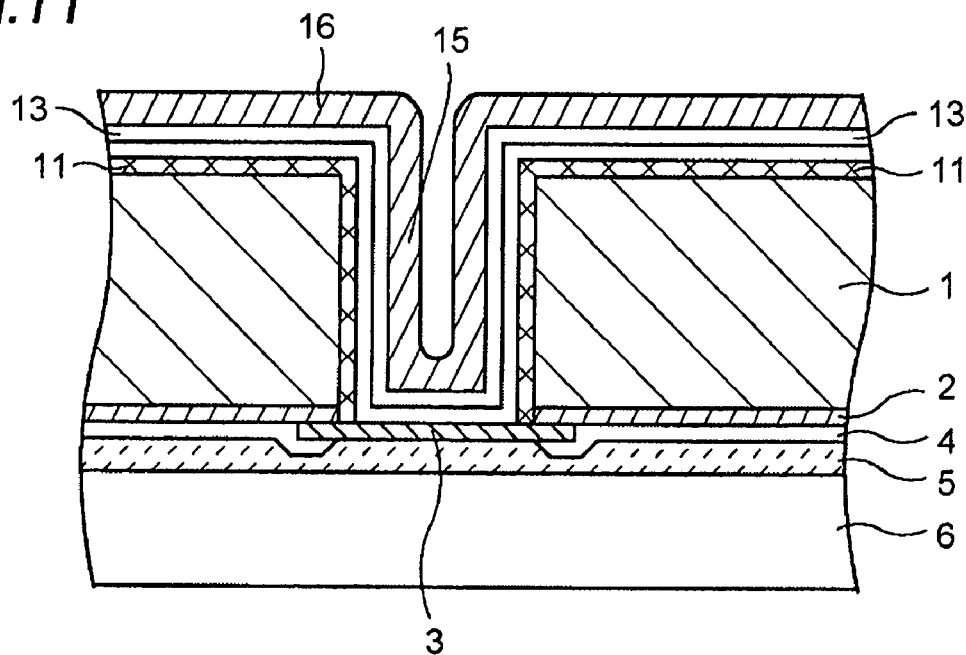

Note that the through-hole electrode 15 does not necessarily fill the via hole 9 completely, and may fill it incompletely as shown in FIG. 11. With a structure described above, the conductive material needed to form the through-hole electrode 15 and the wiring layer 16 can be saved, while throughput is improved since the through-hole electrode 15 and the wiring layer 16 can be formed in less time compared with the case in which the via hole 9 is filled completely.

Figure 9:
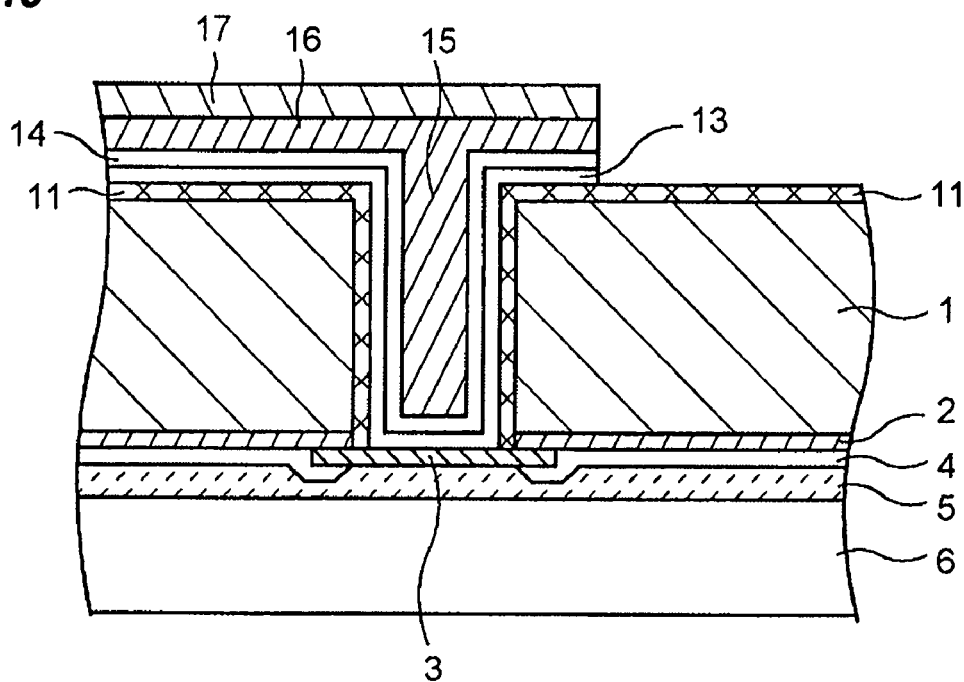

Next, a photoresist layer 17, that is used to shape the wiring layer 16 into a wiring pattern, is formed selectively on the wiring layer 16 on the back surface of the semiconductor substrate 1, as shown in FIG. 9. Next, unnecessary portions of the wiring layer 16 and the seed layer 14 are removed by etching using the photoresist layer 17 as a mask. The wiring layer 16 is shaped into the predetermined wiring pattern by the etching. Following the above, the barrier layer 13 formed on the back surface of the semiconductor substrate 1 is selectively removed by etching using the wiring layer 16 as a mask.

It is preferable to perform the process of etching each layer (the wiring layer 16, the seed layer and the barrier layer 13) using this photoresist layer 17 as a mask and the process of removing the photoresist layer 17 sequentially in the same etcher for enhancing the production efficiency.

The barrier layer 13, the seed layer 14, the through-hole electrode 15 and the wiring layer 16 are not limited to be formed as described above.

Figure 10:
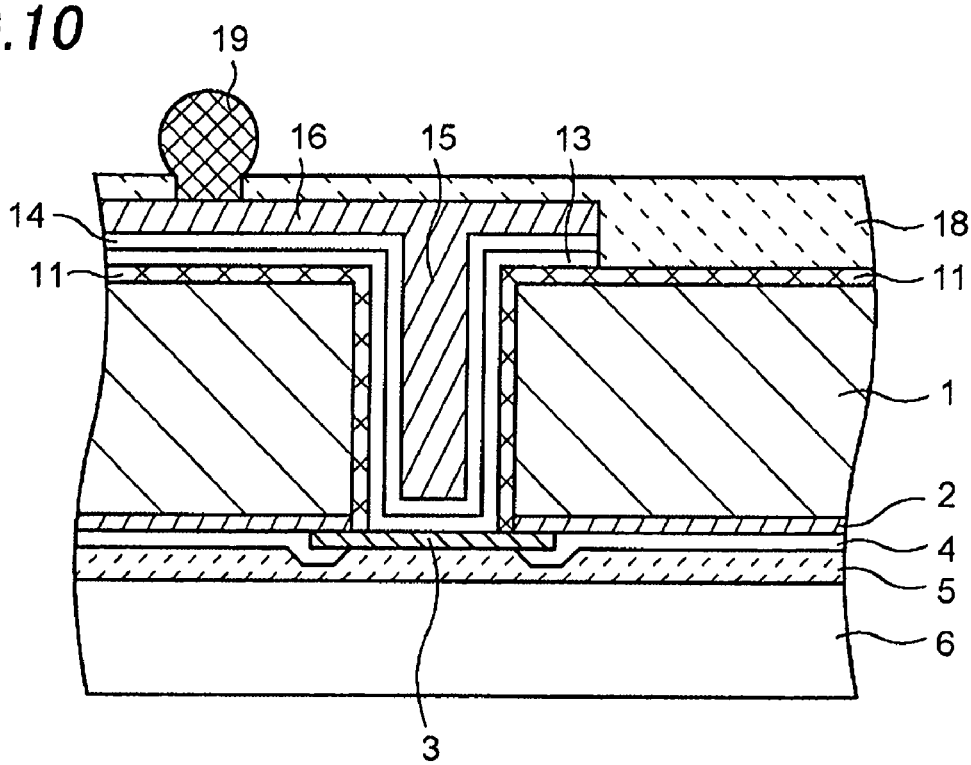

Next, a protection layer 18 made of an organic material such as solder resist or an inorganic material such as a silicon nitride film is formed on the back surface of the semiconductor substrate 1, as shown in FIG. 10. An opening is formed in a region of the protection layer 18 where a conductive terminal is to be formed, and an electrode connection layer (not shown) made of nickel (Ni) and gold (Au) is formed on the wiring layer 16 exposed in the opening. After that, a solder is screen-printed on the electrode connection layer and ball-shaped conductive terminal 19 is formed by reflowing the solder by heat treatment.

The conductive terminal 19 may be formed by a so-called dispenser method (a coating method) in which a ball-shaped terminal or the like made of a solder or the like is coated using a dispenser or by electrolytic plating or the like. Also, there is a case of other embodiment, in which the conductive terminal 19 is not formed. In this case, the electrode connection layer or the wiring layer 16 is exposed in the opening in the protection layer 18. And the electrode connection layer or the wiring layer 16 is connected with an electrode of another device.

The supporter 6 may be left bonded to the semiconductor substrate 1, or separated from the semiconductor substrate 1 so that it can be recycled.

With the processing steps described above, there is completed the semiconductor device of a chip size package type in which a wiring from a conductor (the pad electrode 3) provided on the front surface to a conductor (the wiring layer 16, the conductive terminal 19) provided on the back surface is implemented through the via hole 9. When the semiconductor device is incorporated into electronic equipment, it is electrically connected with an external circuit by mounting the conductive terminal 19 on a wiring pattern on a circuit board.

In this manner of this embodiment, since the etching process and the process of removing the mask layer used in the etching process are sequentially performed with the semiconductor substrate placed in the same etcher, the number of times to transfer the semiconductor substrate is reduced compared with the conventional method. Therefore, the manufacturing time is reduced, the production efficiency is enhanced, and the reliability and the yield of the semiconductor device are enhanced. Furthermore, there is no need to prepare dedicated apparatuses for the etching process and the process of removing the mask layer respectively, thereby reducing the manufacturing cost.

Furthermore, in this embodiment, since the process of removing the damaged layer formed by the back grinding is performed at the same time as the process of smoothing the sidewall of the via hole subsequently after the process of removing the mask layer in the same apparatus, the manufacturing process is optimized compared with the conventional method.

Since the back surface of the semiconductor substrate and the sidewall of the via hole are smoothed, it is made possible to form a highly homogeneous film on the back surface of the semiconductor substrate and in the via hole. In a sputtering process, for example, homogenizing a deposited amount of sputtered particles onto the sidewall of the via hole 9 can be facilitated. Also, in the case of CVD, a reaction gas reaches the sidewall evenly, making it possible to prevent insufficient coverage. In addition, excessive film forming is no longer needed because possibility of insufficient coverage due to the rough surface such as the scallops has been eliminated. Thus the productivity is improved and a thickness of the film formed in the via hole 9 can be reduced.

The scallops do not affect film forming in later process steps, and thus highly reliable plating is made possible. Since all films formed on the sidewall of the via hole 9 are formed favorably, the reliability and the yield of the semiconductor device are improved.

Although the semiconductor devices are the BGA (Ball Grid Array) type semiconductor devices that have the ball-shaped conductive terminal 19 in the embodiments described above, the embodiments of this invention may be applied to semiconductor devices of other types such as LGA (Land Grid Array) type, CSP (Chip Size Package) type and flip-chip type that have no ball-shaped conductive terminal.

Also, this invention is not limited to the embodiments described above and may be modified within the scope of the invention.

Figure 12:
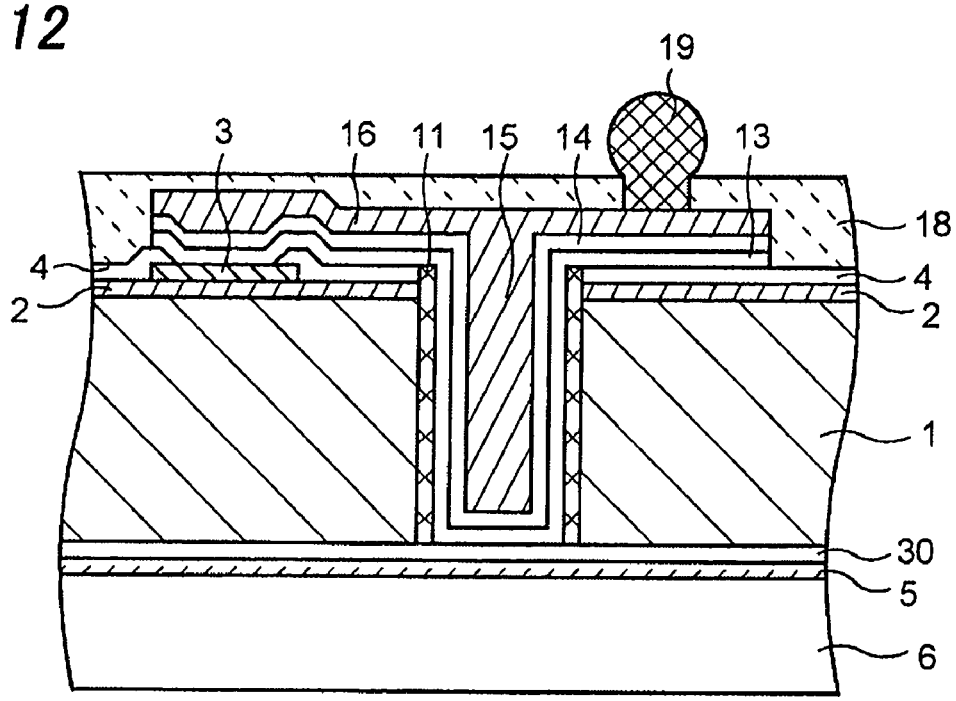
Figure 13A:
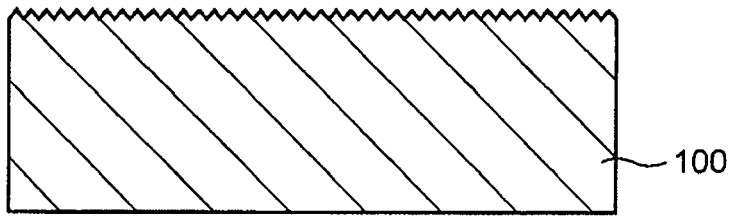
FIGS. 13A to 13E are cross-sectional views showing a conventional method of manufacturing a semiconductor device.
Figure 13B:
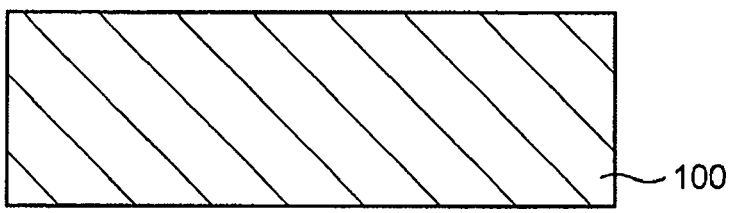
Figure 13C:
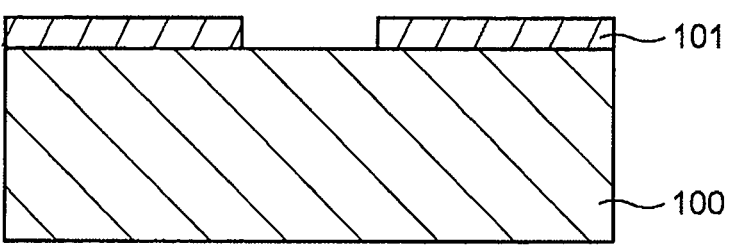
Figure 13D:
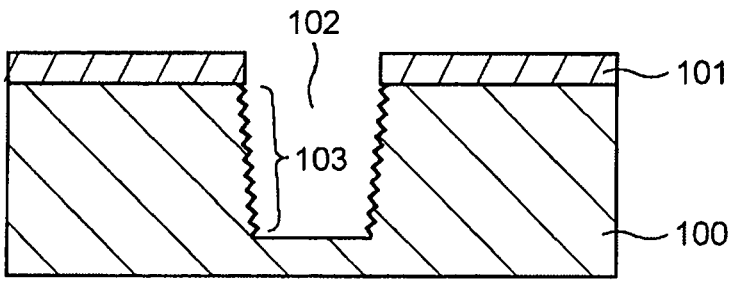
Figure 13E:
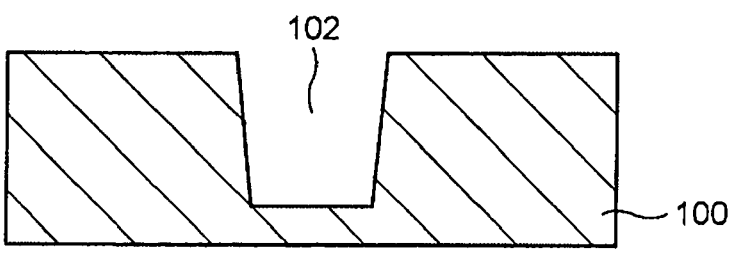
Figure 14A:
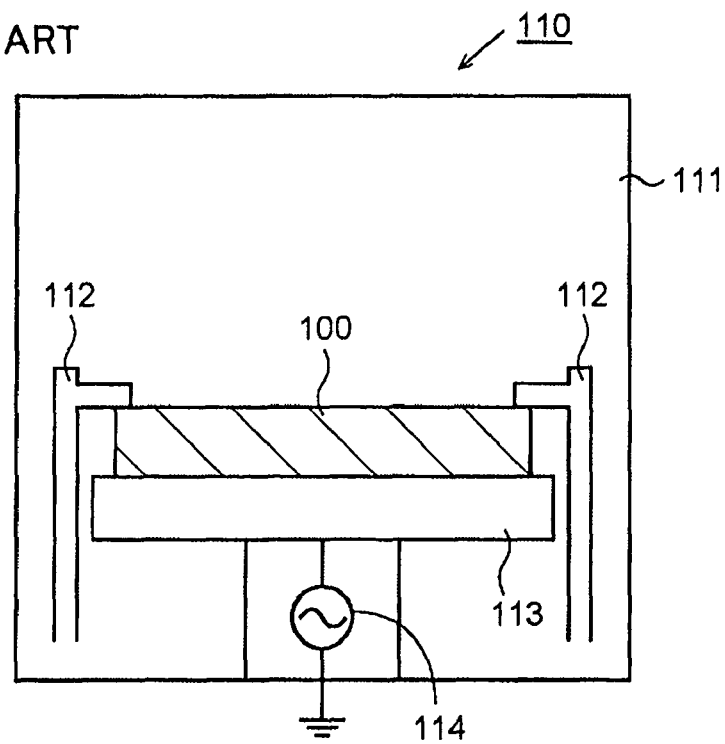
FIGS. 14A and 14B are a cross-sectional view and a plan view showing an etcher used in the conventional method of manufacturing the semiconductor device.
Figure 14B:
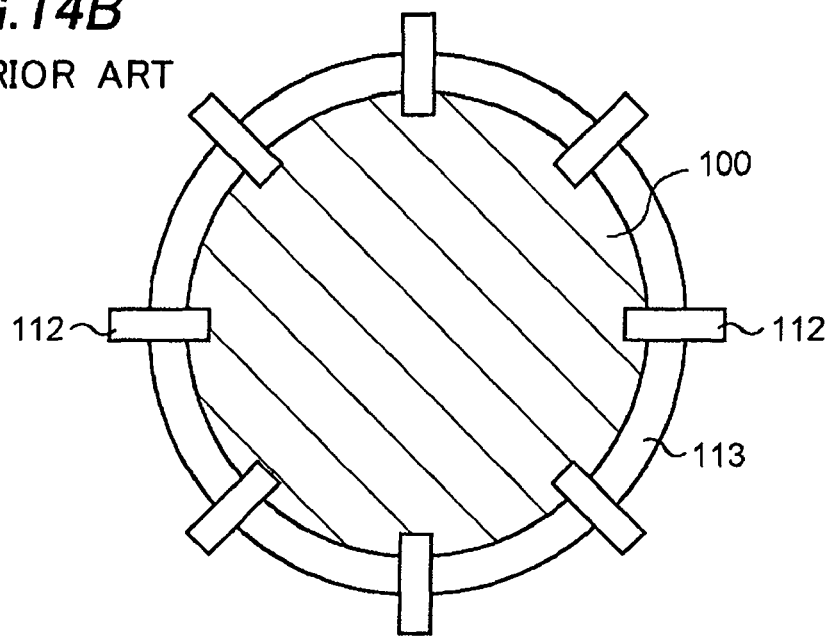

For example, although the supporter is bonded to the front surface (device side surface) of the semiconductor substrate 1 in the embodiments described above, the supporter 6 may be bonded to the other surface (non-device side surface) as shown in FIG. 12 to manufacture a desired semiconductor device. The pad electrode 3, the wiring 16, the conductive terminal 19 and the like are formed on the front surface (device side surface) of the semiconductor substrate 1 in this semiconductor device. When the semiconductor device is incorporated into electronic equipment, it is electrically connected with an external circuit by mounting the conductive terminal 19 on a wiring pattern on a circuit board. It is also possible that an opening is formed in an insulation film 30 (a silicon oxide film formed by CVD, for example) on the back surface of the semiconductor substrate 1 at a location corresponding to the through-hole electrode 15 after the supporter 6 is separated and removed, and a conductive terminal of another semiconductor device is connected to the opening to implement stacked layers of the semiconductor devices. Note that the same structures in FIG. 12 as those already described above are denoted by the same symbols and explanations on them are omitted. The supporter may be bonded to either surface of the semiconductor substrate as described above.

In the manufacturing method of the semiconductor device of the invention, the etching process and the process of removing the mask layer used in the etching process are performed in the same apparatus. Therefore, it is not necessary to transfer the semiconductor substrate between the etcher and the asher as has been needed in the conventional method, and thus the production efficiency is improved. Furthermore, since a defect caused by the transfer of the semiconductor substrate is reduced, a semiconductor device with high reliability is manufactured with high yield.

What is claimed is:

1. A method of manufacturing a semiconductor device, comprising:
   providing a semiconductor substrate;
   grinding a surface of the semiconductor substrate so as to thin the semiconductor substrate;
   forming a mask layer selectively on the ground surface of the semiconductor substrate;
   dry etching the semiconductor substrate in an etching apparatus so as to form an opening in the semiconductor substrate using the mask layer as a mask;
   removing the mask layer by etching while the semiconductor substrate is still in the etching apparatus after the formation of the opening; and
   smoothing the ground surface of the semiconductor substrate,
   wherein the removing of the mask layer and the smoothing of the ground surface of the semiconductor substrate are sequentially performed while the semiconductor substrate is placed in the etching apparatus.

2. The method of claim 1, wherein the etching apparatus is an ICP type apparatus.

3. A method of manufacturing a semiconductor device, comprising:
   providing a semiconductor substrate;
   grinding a surface of the semiconductor substrate so as to thin the semiconductor substrate;
   forming a mask layer selectively on the ground surface of the semiconductor substrate;
   dry etching the semiconductor substrate in an etching apparatus so as to form an opening in the semiconductor substrate using the mask layer as a mask;
   removing the mask layer by etching while the semiconductor substrate is still in the etching apparatus after the formation of the opening; and
   smoothing a sidewall of the opening and the ground surface of the semiconductor substrate after the removal of the mask layer,
   wherein the removing of the mask layer and the smoothing of the sidewall of the opening and the ground surface of the semiconductor substrate are sequentially performed while the semiconductor substrate is placed in the etching apparatus.

4. The method of claim 3, wherein the etching apparatus is configured to perform a Bosch process.

5. A method of manufacturing a semiconductor device, comprising:
   providing a semiconductor substrate;
   forming a mask layer selectively on a surface of the semiconductor substrate;
   dry etching the semiconductor substrate in an etching apparatus so as to form an opening in the semiconductor substrate using the mask layer as a mask; and
   removing the mask layer by etching while the semiconductor substrate is still in the etching apparatus after the formation of the opening,
   wherein the forming of the opening in the semiconductor substrate comprises performing a plasma etching for forming a trench in the semiconductor substrate, performing a plasma deposition for depositing a protection film on a sidewall of the trench, and repeating the plasma etching and the plasma deposition alternately.

6. A method of manufacturing a semiconductor device, comprising:

providing a semiconductor substrate;

grinding a surface of the semiconductor substrate so as to thin the semiconductor substrate;

forming a mask layer selectively on the ground surface of the semiconductor substrate;

dry etching the semiconductor substrate in an etching apparatus so as to form an opening in the semiconductor substrate using the mask layer as a mask;

removing the mask layer by etching while the semiconductor substrate is still in the etching apparatus after the formation of the opening;

smoothing the ground surface of the semiconductor substrate after the removal of the mask layer; and forming an insulation film on a sidewall of the opening of the semiconductor substrate and forming a through-hole electrode on the insulation film.

* * * * *